US011621704B2

United States Patent
Gupta et al.

(10) Patent No.: US 11,621,704 B2
(45) Date of Patent: Apr. 4, 2023

(54) INPUT SCHMITT BUFFER OPERATING AT A HIGH VOLTAGE USING LOW VOLTAGE DEVICES

(71) Applicant: Synopsys, Inc., Mountain View, CA (US)

(72) Inventors: Rahul Gupta, Haryana (IN); Nitin Bansal, Gurgaon (IN); Sriram Kumar Jayanthi, Rajahmundry (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/523,490

(22) Filed: Nov. 10, 2021

(65) Prior Publication Data

US 2022/0149822 A1 May 12, 2022

Related U.S. Application Data

(60) Provisional application No. 63/111,973, filed on Nov. 10, 2020.

(51) Int. Cl.
*H03K 3/00* (2006.01)
*H03K 3/037* (2006.01)
*H03K 3/3565* (2006.01)

(52) U.S. Cl.
CPC ........ *H03K 3/0377* (2013.01); *H03K 3/3565* (2013.01)

(58) Field of Classification Search
None
See application file for complete search history.

(56) References Cited

U.S. PATENT DOCUMENTS

| | | | |
|---|---|---|---|
| 6,181,172 B1 * | 1/2001 | Callahan | H03K 3/3565 327/437 |
| 6,690,222 B2 * | 2/2004 | Nair | H03K 3/012 327/205 |
| 6,784,700 B1 | 8/2004 | Hunt et al. | |
| 9,467,125 B2 * | 10/2016 | Kumar | H03K 3/3565 |
| 9,496,874 B2 * | 11/2016 | Kim | H03K 19/018521 |
| 10,637,446 B1 * | 4/2020 | Mathur | H04B 1/18 |
| 2005/0104641 A1 * | 5/2005 | Chen | H03K 3/3565 327/205 |
| 2007/0057703 A1 | 3/2007 | Kumar et al. | |
| 2016/0182022 A1 | 6/2016 | Kumar et al. | |
| 2019/0173471 A1 * | 6/2019 | Chen | H03K 19/00384 |

* cited by examiner

*Primary Examiner* — Tuan T Lam
(74) *Attorney, Agent, or Firm* — Lowenstein Sandler LLP

(57) ABSTRACT

An input buffer circuit includes a tracking circuit that produces a tracking signal and an inverter including a cascade of low voltage switching devices coupled to an output of the tracking circuit. The tracking signal follows a first signal during a first time period and a second signal during a second time period. The tracking circuit is configured to reduce an input high voltage/input low voltage (VIH/VIL) spread.

20 Claims, 12 Drawing Sheets

INPUT SCHMITT BUFFER OPERATING AT A HIGH VOLTAGE USING LOW VOLTAGE DEVICES

CROSS-REFERENCE TO RELATED APPLICATIONS

The present application claims the benefit under 35 U.S.C. § 119(e) of U.S. Provisional Patent Application No. 63/111,973 filed on Nov. 10, 2020, which is incorporated herein by reference in its entirety for all purposes.

TECHNICAL FIELD

The present disclosure relates to an input buffer for integrated circuits. In particular, the present disclosure relates to an input Schmitt buffer operating at a high voltage using low voltage devices.

BACKGROUND

Input buffers are used in various blocks on application specification integrated circuits (ASICs). The input buffers are used as peripheral devices in a block for receiving data from other on-chip devices. In complementary metal-oxide-semiconductor (CMOS) technologies, devices may have a low maximum tolerable voltage. However, there are number of peripheral devices that operates at voltages higher than the low maximum tolerable voltages of the CMOS devices.

SUMMARY

In one aspect, an input buffer circuit includes a tracking circuit that produces a tracking signal and an inverter including a cascade of low voltage switching devices coupled to an output of the tracking circuit. The tracking signal follows a first signal during a first time period and a second signal during a second time period. The tracking circuit is configured to reduce an input high voltage/input low voltage (VIH/VIL) spread.

In one aspect, a circuit for an input buffer includes a tracking circuit that generates a tracking signal and an inverter configured to receive the tracking signal at an input node. The tracking signal follows an input signal between a first value of the input signal and a second value of the input signal. The circuit is configured to reduce a spread between a high trip point and a low trip point of the inverter.

In one aspect, an integrated circuit includes an inverter comprising a cascade of low voltage switching devices, an input voltage limiting circuit, and a selection circuit. The selection circuit is configured to select one of an output of the input voltage limiting circuit or an input signal to provide an input for the inverter. The selection circuit is configured to reduce an input high voltage/input low voltage (VIH/VIL) spread of the inverter.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
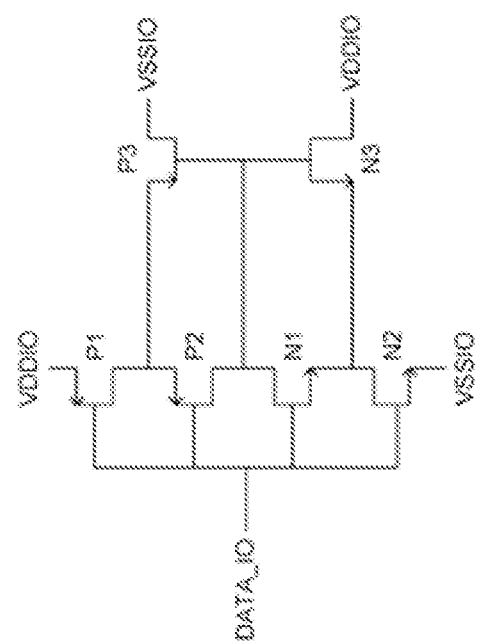
FIG. 1 illustrates an example Schmitt circuit, in accordance with an embodiment of the present disclosure.

Aspects of the present disclosure relate to an input Schmitt buffer operating at a high voltage using low voltage devices. The input buffer has an ageing resistant Schmitt architecture that operates at a high voltage (e.g., 3.3 V) using low voltage devices (e.g., 1.8 V devices).

A system on chip (SOC)'s peripheral circuits may interact with other chips which can operate at different voltages. In lower technology nodes, the gate oxide breakdown limit also scales. As a result, reliability challenges arise where input/output (I/O) devices operating at a high voltage are designed to use low voltage devices in their circuitry. JEDEC (Solid State Technology Association) specification are defined for various IO's like general purpose input/output (GPIO), inter-integrated circuit (I2C), improved inter-integrated circuit (I3C), embedded multimedia card (EMMC), and the like. It is challenging to meet logic low/logic high (VIH/VIL) and hysteresis JEDEC specification of general-purpose I/O operating at 3.3 V using 1.8 V devices. In particular, JEDEC is difficult to meet to the increasing spread in VIH/VIL due to the decrease in gain in the circuit around the rise and fall trip point. A trip point may refer to the voltage level that when passed through by an input signal whose voltage is increasing or decreasing results in a transition at the output of the circuit.

An input buffer using a comparator-based topology may require a reference voltage for better control on VIH and VIL process voltage temperature (PVT) spread, at the cost of area and/or power. The comparator-based topology may include a bandgap circuit to operate that leads to additional area and power consumption. The input buffer may have a conventional Schmitt based topology that does not require any reference voltage. When a conventional Schmitt circuit is cascaded for high voltage operation, the circuit tends to behave nonlinearly in certain zones when an input voltage (e.g., PAD (I/O circuitry) voltage) is ramping from logic 0 (e.g., ground voltage) to logic 1 (e.g., supply voltage) and vice versa. These nonlinearities decrease the gain of a first stage of the circuit around the rise and fall trip points thereby increasing the spread in VIH/VIL across PVT. In addition, the conventional Schmitt based topology does not address the challenge of reliability hot carrier injection (HCI) and bias temperature instability (BTI) when a PAD voltage is not sitting at rail to rail voltage.

Embodiments disclosed herein solve the problem of high VIH/VIL spread and reliability in HCI and BTI.

Advantages of the present disclosure include, but are not limited to, an improvement in input high voltage/input low voltage (VIH/VIL) spread across process voltage temperature (PVT) by enhancing the input inverting stage gain with the topology described herein. The architecture described herein can also improve ageing/reliability of a design and minimize VIH/VIL degradation with time. The Schmitt architecture is suitable for various JEDEC standards based I/O like general purpose IO, I2C, I3C, EMMC, and the like.

In some embodiments, the input buffer circuit may include a tracking circuit that generates a tracking signal. The tracking signal follows a first signal during a first time period and a second signal during a second time period. The zone where the circuit tends to become nonlinear is removed by using the tracking signal, which helps in controlling the VIH/VIL spread across PVT. Improved gain also addresses the reliability problem (aging) when input is left floating, because of the higher gain of the circuit tend to sit at logic 0 or logic 1 strongly, thereby minimizing HCI and bias temperature instability BTI degradation problems. Thus, the devices show minimal aging and the difference between VIL/VIH for fresh and aged design is minimal.

FIG. 1 illustrates an example Schmitt circuit 100, in accordance with an embodiment of the present disclosure. Circuit 100 includes PMOS transistors P1, P2, and P3 and NMOS transistors N1, N2, and N3. An input signal (labeled DATA_IO in FIG. 1) is coupled to the gate of transistors P1, P2, N1, and N2. When the input is rising from 0 to a supply voltage (labeled VDDIO in FIG. 1), transistors N1 and N2 have to sink extra current to toggle the output (i.e., VIH or rising threshold of the Schmitt inverter is higher than VDDIO/2). Similarly when the input signal is falling from the supply voltage to zero (i.e., VDDIO to 0), transistors P1 and P2 have to source extra current to toggle the output (i.e., VIL or falling threshold is lower than VDDIO/2). The difference between VIH and VIL is hysteresis. The process variation of NMOS and PMOS device can lead to VIH and VIL variations and hence variations in the hysteresis. In circuit 100, all the input transistors (i.e., P1, P2, N1, N2) receive a full swing of the input signal thereby not introducing any non-linear zone where the inverting stage gain is minimized and the transition are poorly defined.

Figure 2:
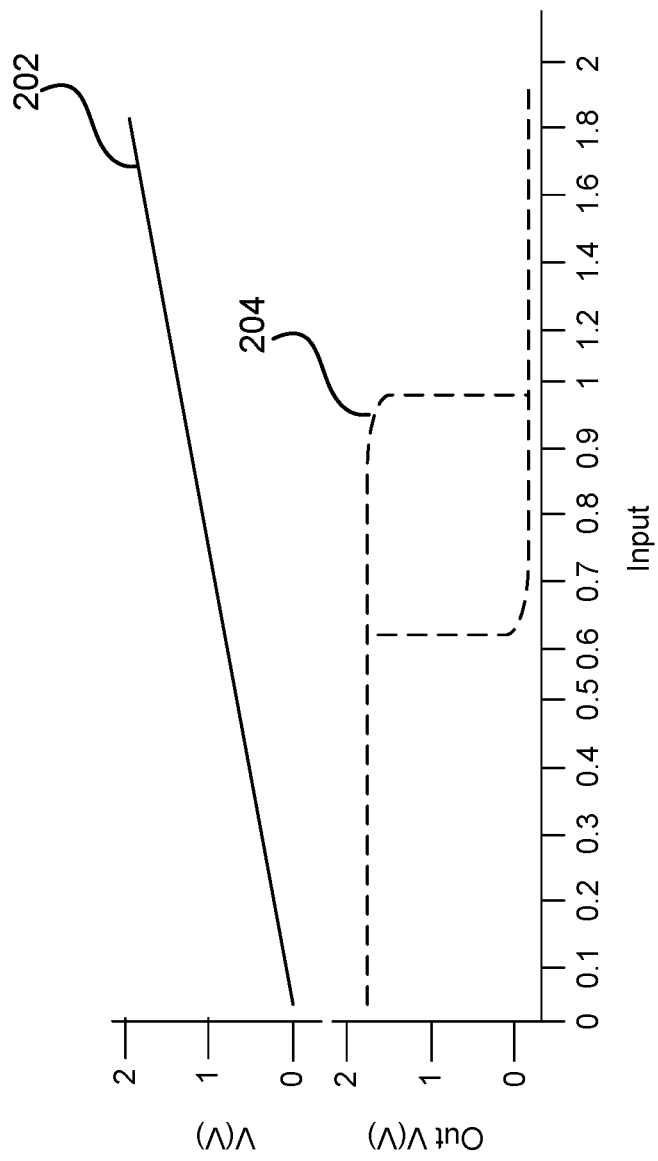
FIG. 2 illustrates a waveform for the example Schmitt circuit, in accordance with an embodiment of the present disclosure.

FIG. 2 illustrates a waveform for circuit 100, in accordance with an embodiment of the present disclosure. The input signal may ramp from logic 0 to logic 1. In some aspects, logic 0 may refer to a relatively low voltage level (e.g., ground voltage), while logic 1 refers to a relative high voltage level (e.g., supply voltage). Trace 202 shows the input signal rising from 0 V to 2 V. Trace 204 shows the relationship between the input signal and the output voltage. Trace 204 shows the hysteresis in the output voltage (VIL about 0.61 V and VIH about 0.99 V).

Figure 3:
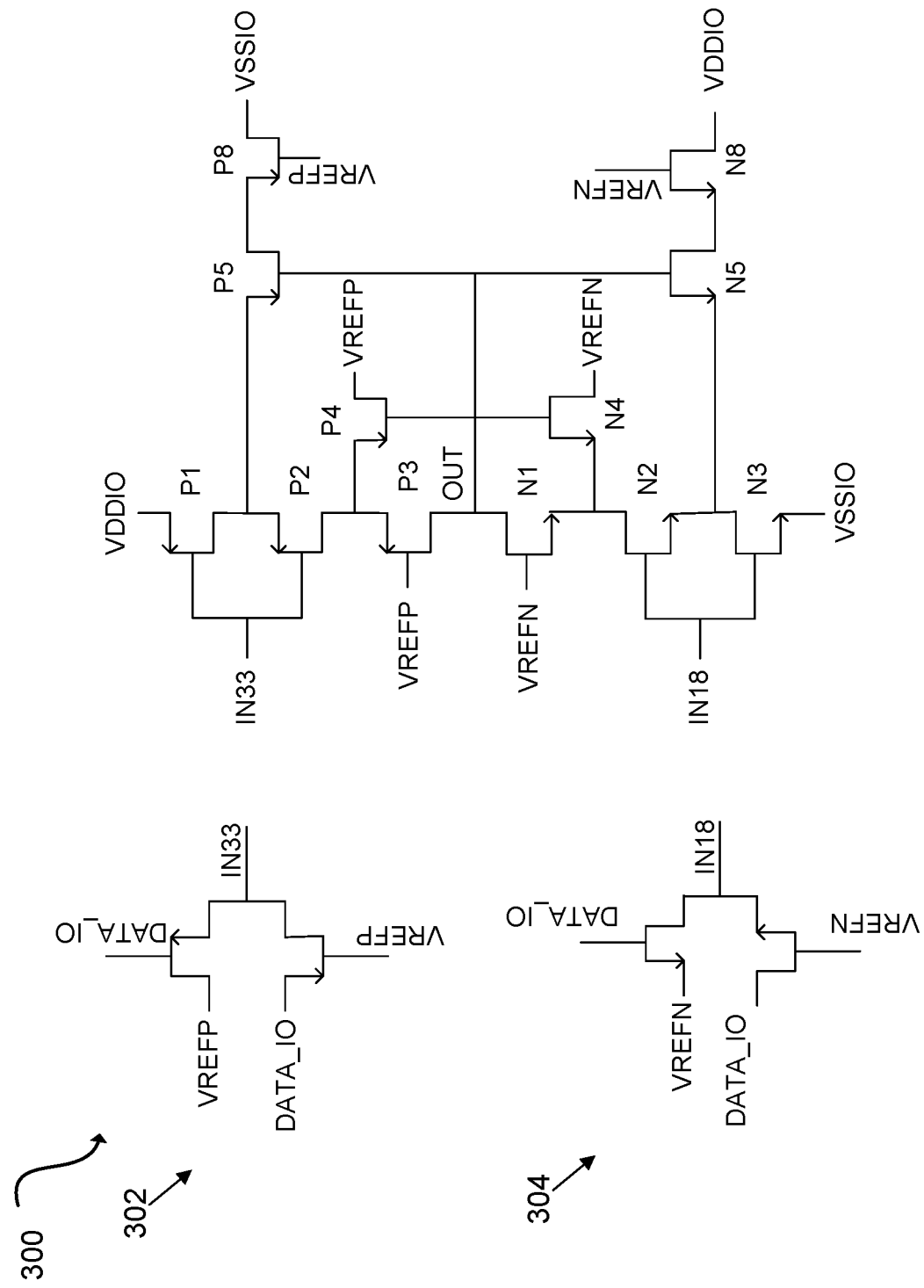
FIG. 3 illustrates an example Schmitt circuit operating at 3.3 V using 1.8 V devices, in accordance with an embodiment of the present disclosure.

FIG. 3 illustrates an example Schmitt circuit 300 operating at high voltage using low voltage devices, in accordance with an embodiment of the present disclosure. Circuit 300 includes a cascaded implementation of Schmitt architecture.

Input signal is coming at node DATA_IO and passed through a first input protection clamp 302 and a second input protection clamp 304. Two internal biasing signals (labeled VREFP and VREFN in FIG. 3) are generated to protect the 1.8 V devices from stress. The voltage level at node IN18 ranges from 0 to VREFN. The voltage level at node IN33 ranges from VREFP to VDDIO.

In some embodiments, circuit 300 includes a transistor P1, a transistor P2, a transistor P3, a transistor N1, a transistor N2, and a transistor N3 connected in series. Respective gates of transistors P1 and P2 are coupled to node IN33. Respective gates of transistors N2 and N3 are coupled to node IN18. The gate of transistor P3 is coupled to node VREFP. The gate of transistor N1 is coupled to node VREFN. Circuit 300 further includes a transistor P4, a transistor P5, a transistor P8, a transistor N4, a transistor N5, and a transistor N8. Transistor P5 and transistor P8 are coupled in series between the drain of transistor P1 and a negative supply voltage (VSSIO) (e.g., ground). Transistor N5 and transistor N8 are coupled in series between the source of transistor N2 and the supply voltage. Transistor P4 is coupled between the drain of transistor P2 and node VREFP. Transistor N4 is coupled between the source of transistor N1 and node VREFN.

Circuit 300 tends to behave nonlinearly when an input signal is ramped from 0 to supply voltage or vice versa. The gain of the cascaded inverter reduces around the trip points because either of the signals at node IN33 or at node IN18 is static when the input signal is ramping up or down as shown in FIG. 4.

Figure 4:
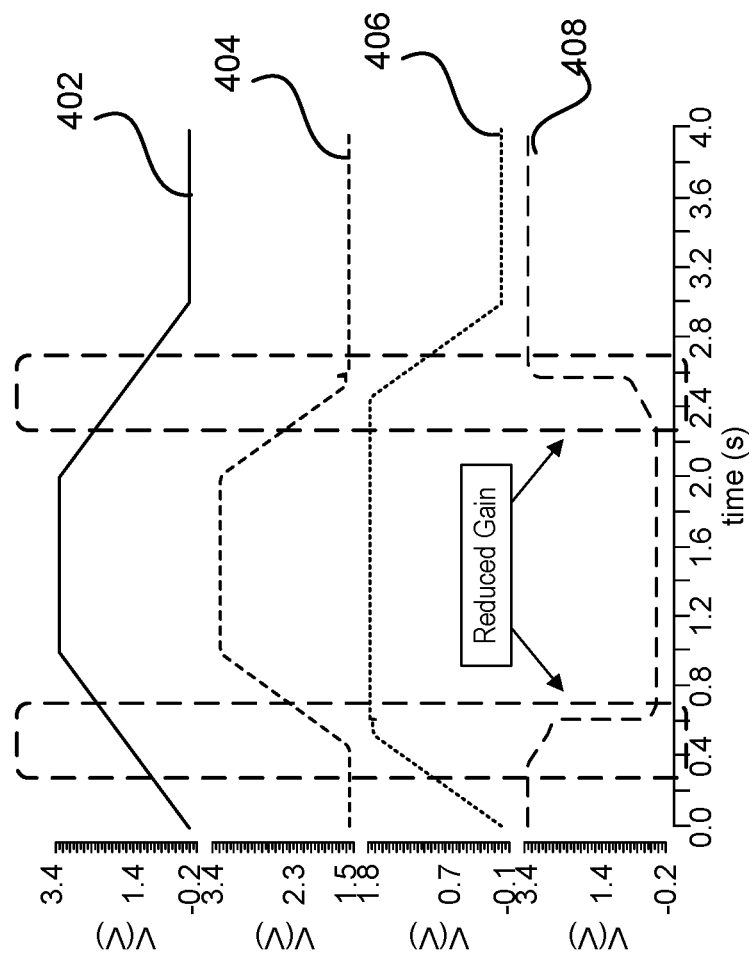
FIG. 4 illustrates a transient analysis of the example Schmitt circuit, in accordance with an embodiment of the present disclosure.

FIG. 4 illustrates a transient analysis of circuit 300, in accordance with an embodiment of the present disclosure. Trace 402 shows the input signal (i.e., at node DATA_IO in FIG. 3). Trace 404 shows the output of first input protection clamp 302 (node IN33 in FIG. 3). Trace 406 shows the output of second protection clamp 304 (node IN18 in FIG. 3). As discussed previously, the signal at node IN18 varies from 0 to VREFN and the signal at node IN33 varies from VREFP to VDDIO. Trace 408 shows the output signal. The VIH/VIL spread becomes higher across PVT because of reduced gain of the first inverting stage thereby making the transition poor as shown by trace 408.

Figure 5:
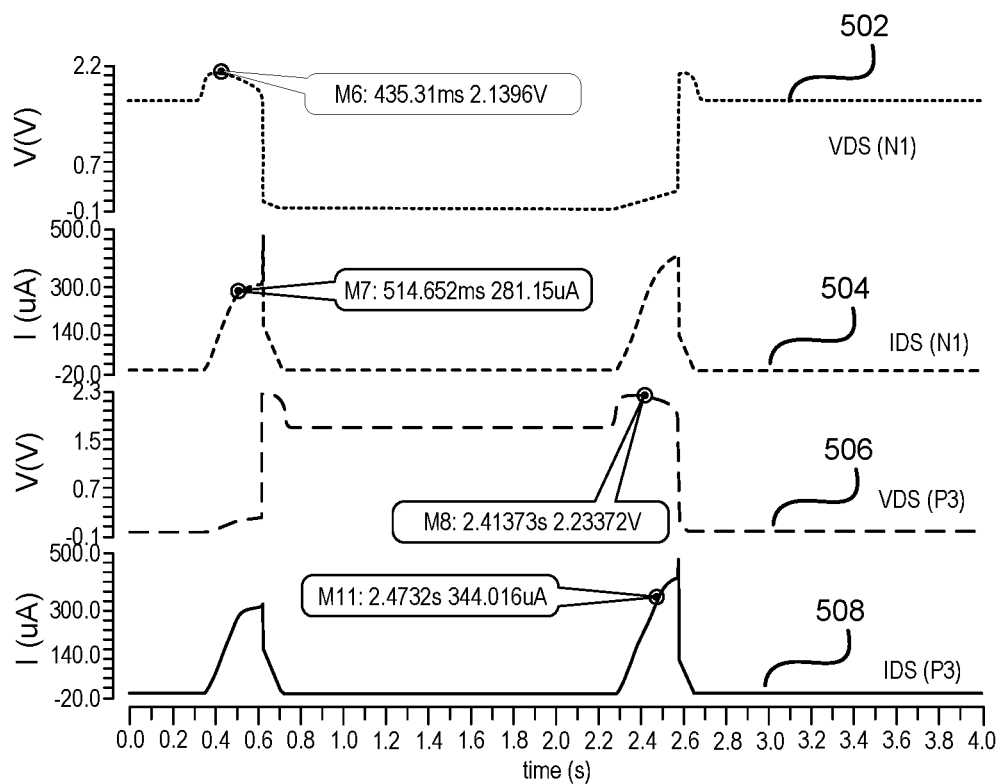
FIG. 5 illustrates a transient response of the circuit, in accordance with an embodiment of the present disclosure.
Figure 5:
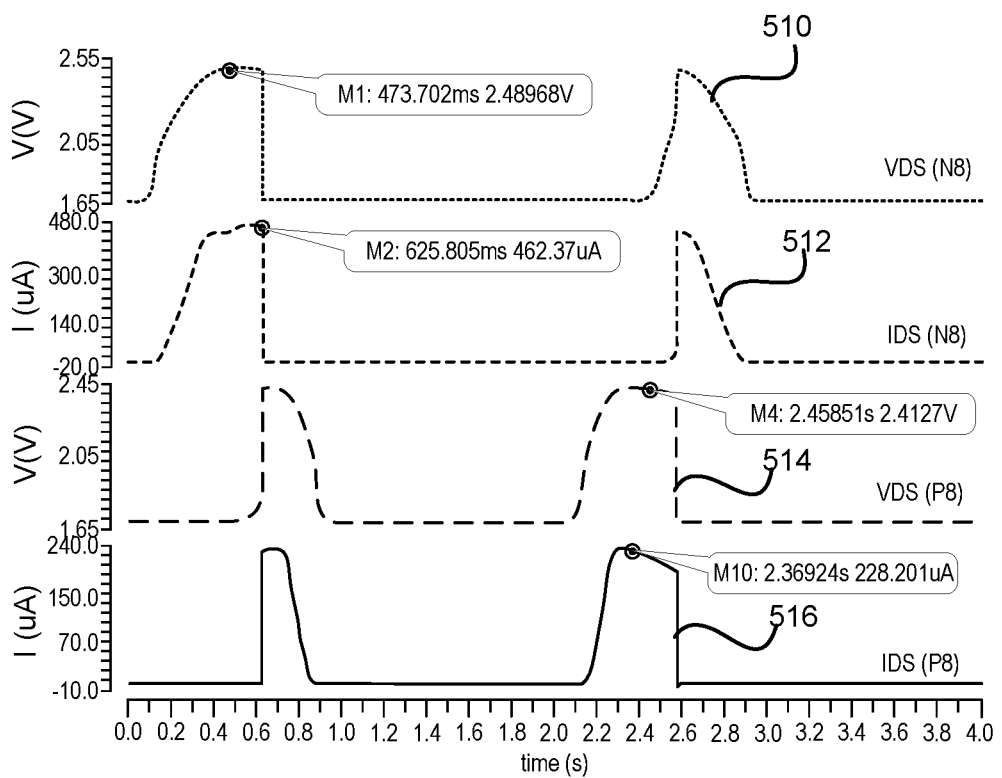

FIG. 5 illustrates a transient response of circuit 300, in accordance with an embodiment of the present disclosure. If the input voltage (e.g., PAD voltage) is held static at VIH/VIL level during the lifetime of circuit 300 then the circuit 300 shows a degradation in VIH/VIL as internal voltages sit at intermediate level and create a short circuit current path from VDDIO to GND. Circuit 300 shows high HCI/BTI and time dependent dielectric breakdown (TDDB) degradations. Trace 502 shows the voltage $V_{DS}$ for transistor N1 in circuit 300. Trace 504 shows the current $I_{DS}$ for transistor N1 of circuit 300. Trace 506 shows the voltage $V_{DS}$ for the transistor P3 of circuit 300. Trace 508 shows the current $I_{DS}$ for transistor P3 in circuit 300. Trace 510 shows the voltage $V_{DS}$ for transistor N8 of circuit 300. Trace 512 shows the current $I_{DS}$ for transistor N8 of circuit 300. Trace 514 shows the voltage $V_{DS}$ for transistor P8 of circuit 300. Trace 516 shows the current $I_{DS}$ for transistor P8 of circuit 300. Transistors N1, P3, N8, and P8 show HCI degradation because of higher $V_{DS}$ and $I_{DS}$.

In some embodiments, the above-mentioned weakness of circuit 300 are overcome by modifying the topology of circuit 300 such that it mimics the operation of a 1.8 V conventional Schmitt design (e.g., circuit 100 of FIG. 1). An example circuit is shown in FIG. 6, however, the specific details and implementation are merely exemplary.

Figure 6:
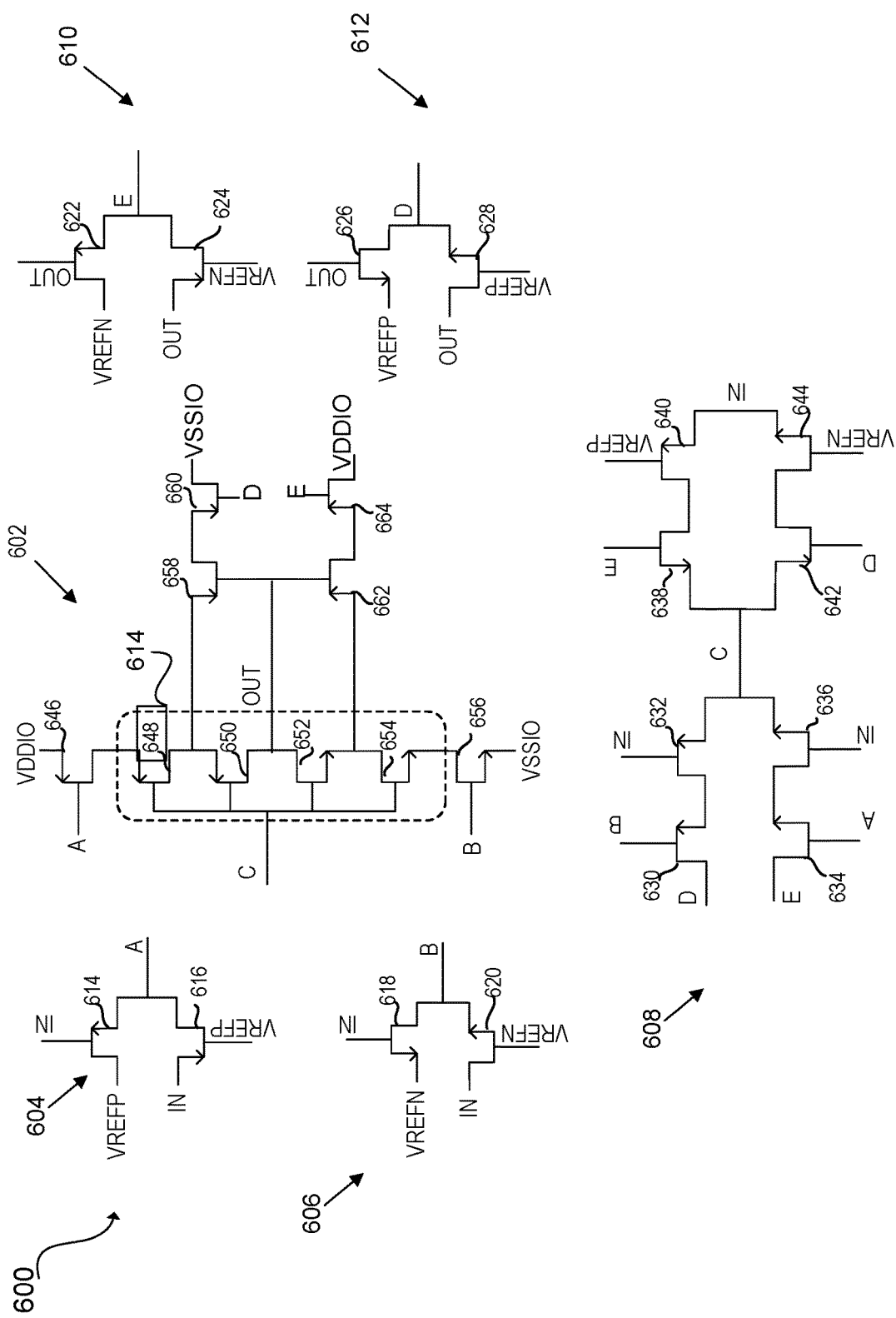
FIG. 6 illustrates an example circuit for an input buffer, in accordance with an embodiment of the present disclosure.

FIG. 6 illustrates an example circuit, in accordance with an embodiment of the present disclosure. A circuit 600 may include a Schmitt topology section 602, a first input voltage limiting circuit 604 (i.e., P-side clamp circuit), a second input voltage limiting circuit 606 (i.e., a N-side clamp circuit), a tracking circuit 608, a first feedback circuit 610, and a second feedback circuit 612.

In some embodiments, an input signal is received at node IN and passed through first input voltage limiting circuit 604 and second input voltage limiting circuit 606. Two internal biasing signals (labeled VREFP and VREFN in FIG. 6) are generated to protect the low voltage devices (e.g., 1.8 V) from stress. The voltage level at node B ranges from 0 to VREFN (limited by the second input voltage limiting circuit 606) and the voltage level at node A signal ranges from VREFP to VDDIO (limited by the first input voltage 604).

In some embodiments, first input voltage limiting circuit 604 may include transistor 614 and transistor 616. Transistor 614 and transistor 616 may be P-type transistors. The source of transistor 616 is coupled to input node IN. The drain of transistor 616 and the source of transistor 614 may be coupled together at node A. The gate of transistor 614 is coupled to input node IN. The gate of transistor 616 is coupled to the drain of transistor 614 at node VREFP.

In some embodiments, second input voltage limiting circuit 606 may include transistor 618 and transistor 620. Transistor 618 and transistor 616 may be N-type transistors. The drain of transistor 620 is coupled to input node IN. The drain of transistor 618 and the source of transistor 620 may be coupled together at node B. The gate of transistor 618 is coupled to input node IN. The gate of transistor 620 is coupled to the source of transistor 618 at node VREFN.

In some embodiments, first feedback circuit 610 is configured to pass the higher of the signal at node VREFN or an output signal at a node E. Second feedback circuit 612 is configured to pass the lower of the lower of the signal at node VREFP or output signal OUT at node D.

In some embodiments, first feedback circuit 610 may include transistor 622 and transistor 624. Transistor 622 and transistor 624 may be P-type transistors. The gate of transistor 622 may be coupled to output node OUT. The drain of transistor 622 and the gate of transistor 624 may be coupled to node VREFN. The source of transistor 622 and the drain of transistor 624 may be coupled together at node E.

In some embodiments, second feedback circuit 612 may include transistor 626 and transistor 628. Transistor 626 and transistor 628 may be N-type transistors. The gate of transistor 626 may be coupled to output node OUT. The source of transistor 626 and the gate of transistor 628 may be coupled to node VREFP. The source of transistor 628 and the drain of transistor 626 may be coupled together at node D.

In some embodiments, tracking circuit 608 may generate a tracking signal at node C. The tracking signal is coupled to an input of Schmitt topology section 602. The tracking signal follows a first signal during a first time period and a second signal during a second time period. For example, the tracking signal may follow the input voltage in the first time period. In the second time period, the tracking signal may be clamped. In some aspects, the tracking signal may follow one of the internal biasing signals. The internal biasing signals may be generated to protect the low voltage devices.

In some embodiments, tracking circuit 608 may include one or more switching circuits that passes (selects) one of the signal at node D, the signal at node E, or the input signal IN.

In some embodiments, a first switching circuit may include a transistor 630 and a transistor 632. First switching circuit may pass the signal D at node C based when the input signal is 0 because transistor 630 and transistor 632 are on. In some aspects, transistor 630 and transistor 632 may be P-type transistors. Transistor 630 and transistor 632 are coupled in series between node D and node C. The gate of transistor 630 is coupled to node B. The gate of transistor 630 is coupled to input node IN.

In some embodiments, a second switching circuit may include a transistor 634 and a transistor 636. Second switching circuit may pass the signal from node E at node C when the input signal at node IN is equal to 1. Transistor 630 and transistor 632 are off and transistor 634 and transistor 636 are on when the input signal is equal to 1. In some aspects, transistor 634 and transistor 636 may be N-type transistors. Transistor 634 and transistor 636 are coupled in series between node E and node C. The gate of transistor 634 is coupled to node B. The gate of transistor 636 is coupled to input node IN. The source of transistor 634 is coupled to the drain of transistor 636.

In some embodiments, a third switching circuit may include a transistor 638, a transistor 640, a transistor 642, and a transistor 644. The third switching circuit may pass the input signal IN to node C when the input is between the signal at node D and the signal at node E. Transistor 638 and transistor 640 are coupled in series between node C and input node IN. Transistor 642 and transistor 644 may be coupled in series between node C and input node IN. In some embodiments, transistors 638 and 644 are N-type transistors. Transistors 640 and 642 are P-type transistors. The gate of transistor 638 is coupled to node E. The gate of transistor 640 is coupled to node VREFP. The gate of transistor 642 is coupled to node D. The gate of transistor 644 is coupled to node VREFN. The source of transistor 640 and the source of transistor 644 are coupled together and to input node IN. The source of transistor 638 and the source of transistor 642 are coupled together at node C.

Schmitt topology section 602 may include a gain boosting section 614. The gain boosting section 614 can help in restoring the gain which is lost in the cascaded Schmitt architecture implemented in FIG. 3.

Figure 7:
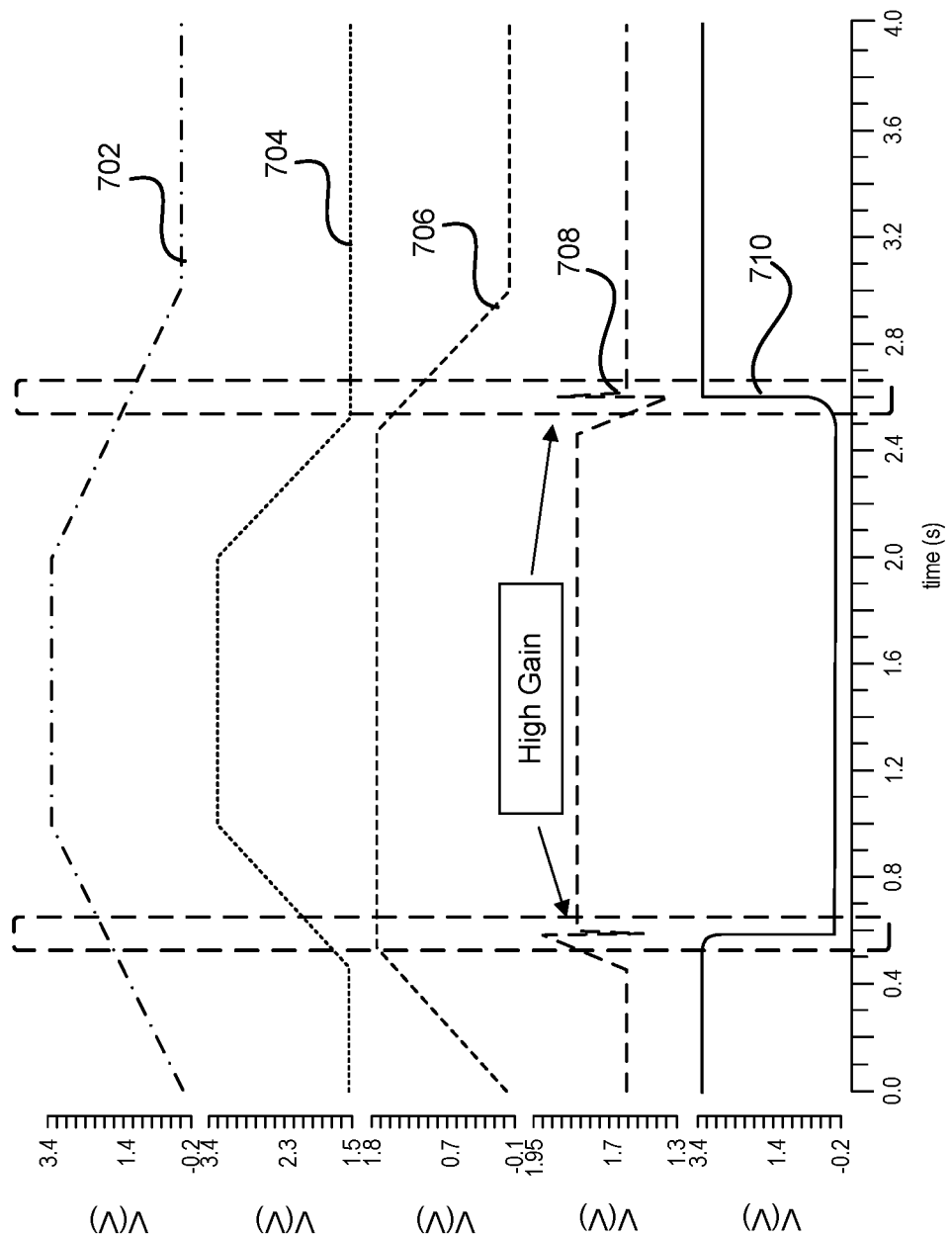
FIG. 7 illustrates signal waveforms for the example circuit for the input buffer, in accordance with an embodiment of the present disclosure.

Schmitt topology section 602 can detect a VIH/VIL threshold. In some embodiments, the tracking signal generated by tracking circuit 608 (at node C) is coupled to an input of gain boosting section 614 of Schmitt section 602. The tracking signal can follow the input signal from VREFP to VIH level during the rising of the input. During the fall of the input, the tracking signal follows the VREFN to VIL level of the input as shown in FIG. 7.

Schmitt topology section 602 includes transistors 646, 648, 650, 652, 654, and 656 connected in series between VDDIO and VSSIO. Schmitt topology section 602 also includes transistors 658, 660, 662, and 664. In some embodiments, transistors 646, 648, 650, 658, 660 may be P-type transistors. Transistors 652, 654, 656, 662, and 664 may be N-type transistors.

The gate of transistors 648, 650, 652, and 654 are coupled to node C (i.e., tracking signal). The gate of transistor 646 is coupled to node A. The gate of transistor 656 is coupled to node B. The gate of transistor 660 is coupled to node D. The gate of transistor 624 is coupled to node E. The gate of transistors 648 and 662 are coupled together and to the drain of transistor 652 at the output node OUT.

In some embodiments, Schmitt topology section 602 complies with CMOS standards with a logic low (VIL) equals to 0.35×VDDIO and a logic high equals to 0.65× VDDIO or 3.3 V.

In some embodiments, the voltages for each transistors in circuit 600 are well defined (i.e., zero or VDDIO) due to the increase in the gain. Thus, the HCI is minimized.

In some embodiments, tracking circuit 608 may be implemented using N-type transistors.

In some embodiments, Schmitt topology section 602 may be implemented using one or more latches. For example, transistor 658, transistor 660, transistor 662, and transistor 664 may be replaced by a latch coupled between the gain boosting section 614 and output node OUT. The latch is configured to provide the Schmitt function.

FIG. 7 illustrates waveforms for the circuit 600. Trace 702 shows the input signal at node IN. Trace 704 shows the output of first input voltage limiting circuit 604 (i.e., signal at node A). Trace 706 shows the output of second input voltage limiting circuit 606 (i.e., signal at node B). Trace 708 shows the output signal from tracking circuit 608 (i.e., signal at node C). Trace 710 shows the output signal at node OUT.

Figure 8:
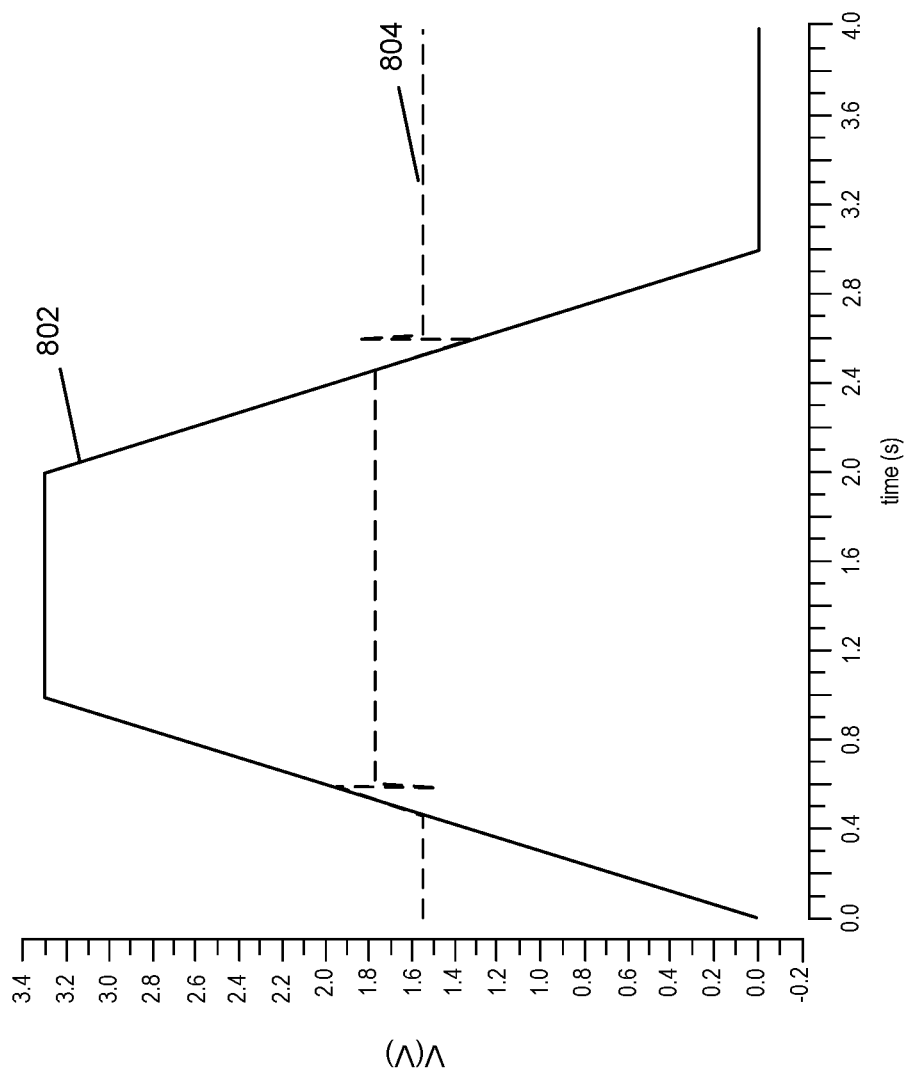
FIG. 8 illustrates waveforms of a reference signal and a data signal, in accordance with an embodiment of the present disclosure.

FIG. 8 illustrates waveforms of the tracking signal at node C of circuit 600 and the input signal at node IN, in accordance with an embodiment of the present disclosure. Trace 804 shows the output of the tracking signal and trace 802 shows the input signal. Traces 802, 804 show that an inverting stage gain has improved. The small glitches on tracking signal (waveform 804) are present because of coupling from the output node. The glitches can be ignored as the glitches may not affect the performance of circuit 600.

The implemented topology (i.e., circuit 600) has been characterized for PVT corners. A reliability simulation has been performed by holding PAD voltage at static level for 10 years. The topology described herein and shown in FIG. 6 can achieve better VIH/VIL spread. Further, even if the PAD is held at VIH/VIL level, internal nodes do not stay at intermediate levels and thus a static current do not flow.

Figure 9:
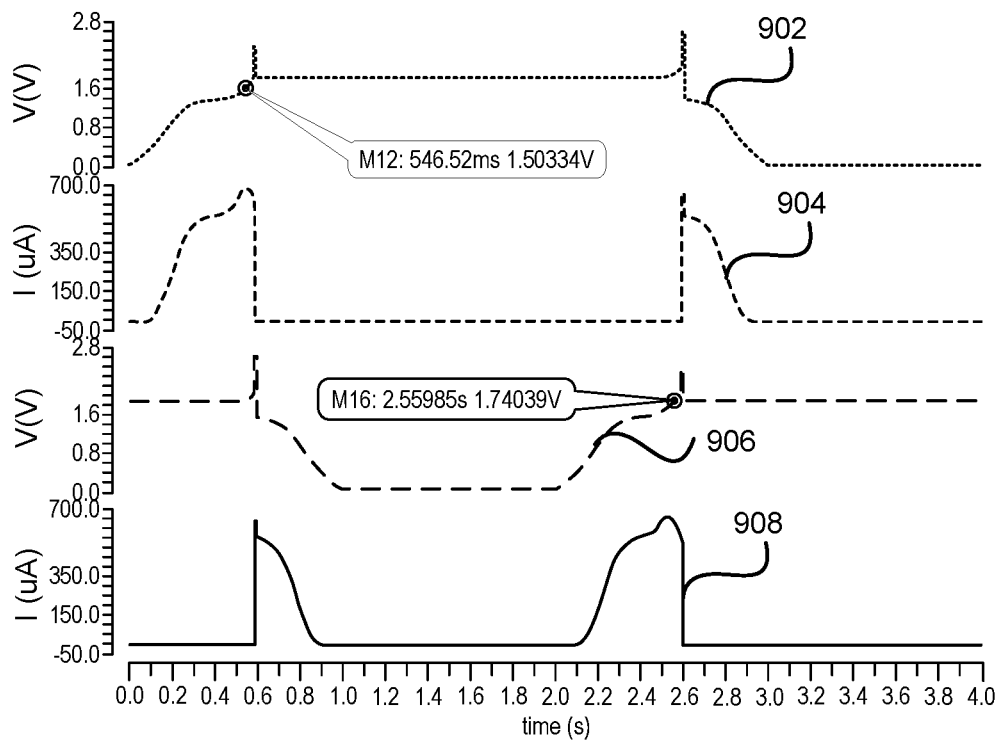
FIG. 9 illustrates input high voltage/input low voltage (VIH/VIL) comparison between fresh and aged results, in accordance with an embodiment of the present disclosure.
Figure 9:
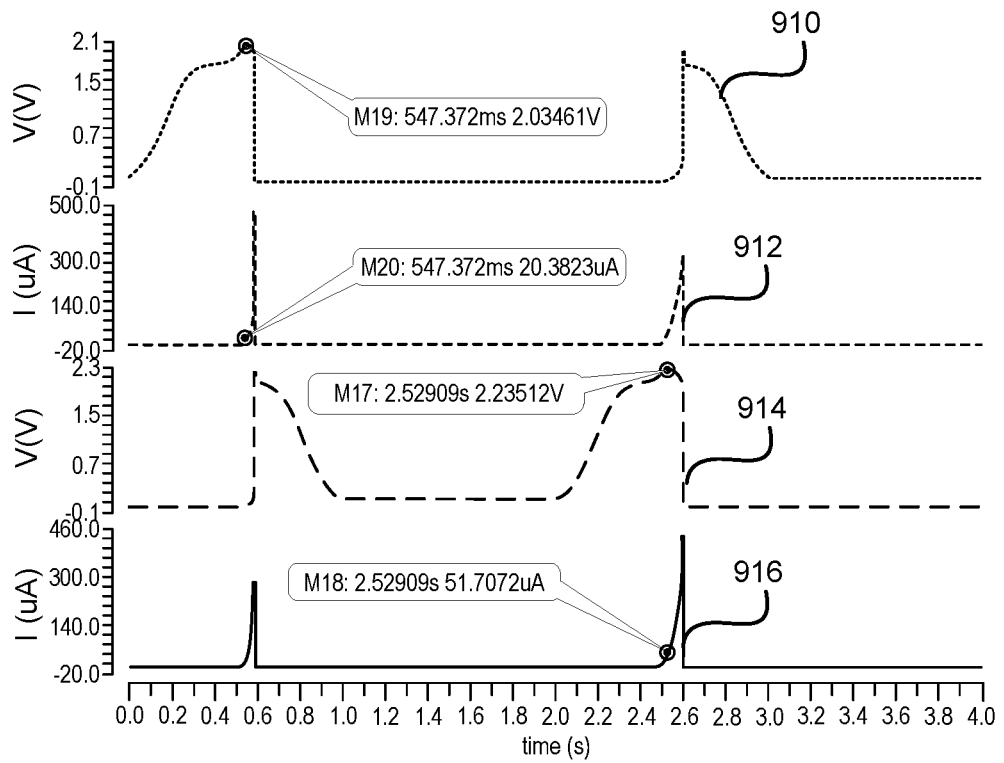

FIG. 9 illustrates a transient response of the circuit 600, in accordance with an embodiment of the present disclosure. Trace 902 shows the voltage $V_{DS}$ for transistor 664. Trace 904 shows the current $I_{DS}$ for transistor 664. Trace 906 shows the voltage $V_{DS}$ for transistor 660. Trace 908 shows the current $I_{DS}$ for transistor 660. Trace 910 shows the voltage $V_{DS}$ for transistor 652. Trace 912 shows the current $I_{DS}$ for transistor 652. Trace 914 shows the voltage $V_{DS}$ for transistor 650. Trace 916 shows the current $I_{DS}$ for transistor 650. Transistors 664, 660, 652, and 650 do not show HCI degradation because the voltage $V_{DS}$ and current $I_{DS}$ do not exceed safe limits. $V_{DS}$ and $I_{DS}$ associated with circuit 600 are lower than the $V_{DS}$ and current $I_{DS}$ shown in FIG. 5 associated with circuit 300.

Table 1 and table 2 show a performance comparison for noise margin between the reference design (circuit 300 of FIG. 3) and the topology described herein (FIG. 6).

TABLE 1

Performance of a reference design of FIG. 3

| 3V3 Mode | Min | Max | Specification | Margin (min) | 1 sigma (At worst corner) |
|---|---|---|---|---|---|
| VIL | 975 m | 1.955 | VIL > 0.3 × VDDIO | 84 m | 13.32 m |
| VIH | 1.445 | 2.455 | VIH < 0.7 × VDDIO | 86 m | 12.11 m |
| HYST | 410 m | 650 m | >0.05 × VDDIO | 261.5 m | 8.965 m |

TABLE 2

Performance of the approaches described herein (e.g., circuit 600)

| 3V3 Mode | Min | Max | Specification | Margin (min) | 1 sigma (At worst corner) |
|---|---|---|---|---|---|
| VIL | 1.115 | 1.625 | VIL > 0.3 × VDDIO | 224 m | 8.432 m |
| VIH | 1.665 | 2.285 | VIH < 0.7 × VDDIO | 224 m | 9.803 m |
| HYST | 500 m | 700 m | >0.05 × VDDIO | 351.5 m | 6.973 m |

Figure 10:
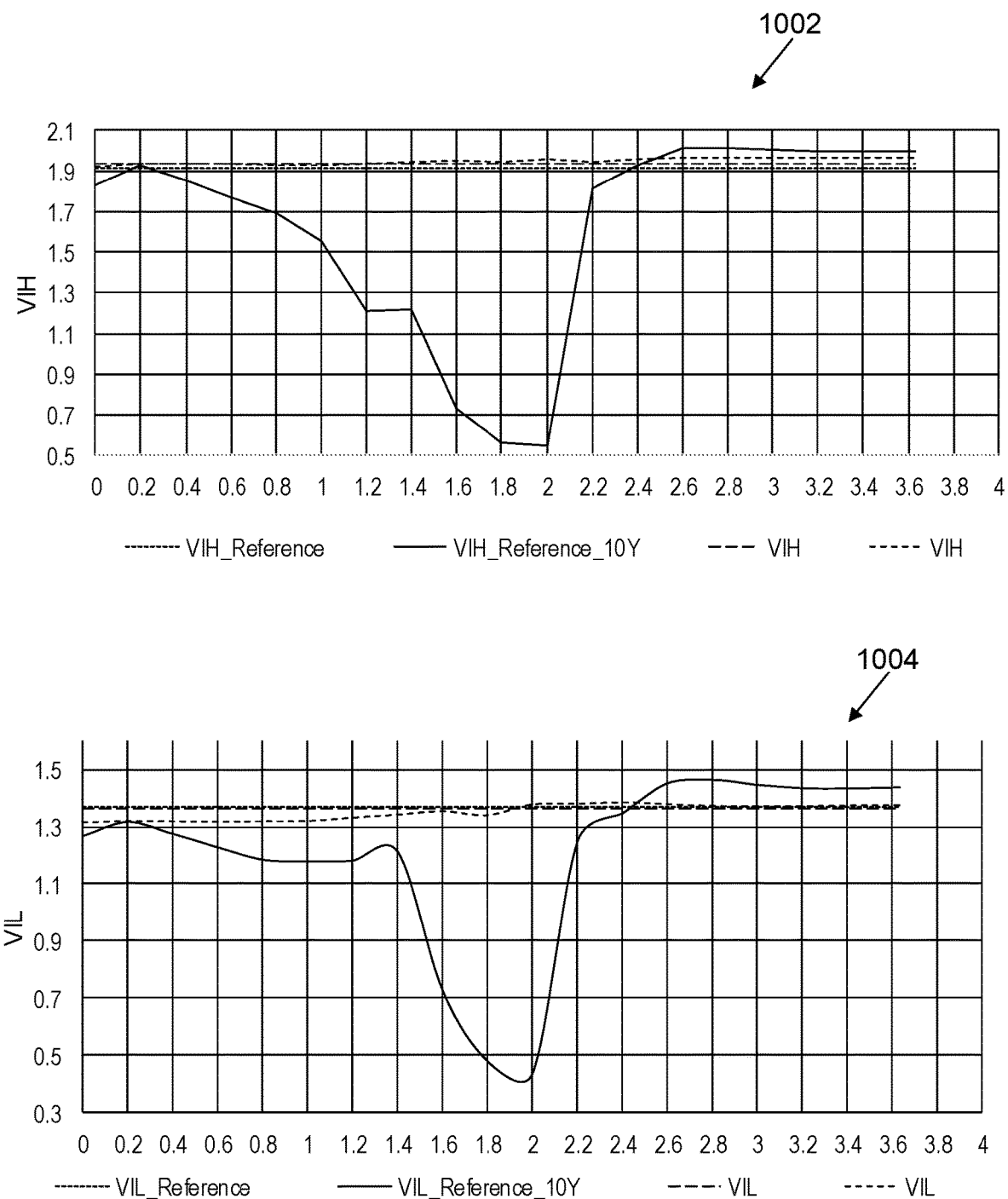
FIG. 10 shows exemplary results for performance comparison for ageing, in accordance with an embodiment of the present disclosure.

FIG. 10 shows exemplary results for performance comparison for ageing. Schematic 1002 shows the VIH comparisons. Schematic 1004 shows the VIL comparisons. The conditions for the simulations are as follows: the fresh/aged are ramp up/down by 1 ms. For the stress analysis, the transient DC is swept from 0 to 3.63 V in steps of 0.2 V. The fresh/aged corner conditions are typical 3.3, 0.8, 125. The stress corner conditions are 3.63, 0.88, 125. Devices show minimal ageing over the 10 years lifetime (i.e., each device is held at the temp for 10 years). The approaches described herein show an improvement in both aspects without adding any extra area and/or power penalty. For example, schematic 1002 shows a difference between for the reference design between the fresh design and the aged design. Similarly, there is difference between the VIL of the fresh reference design and the VIL of the aged reference design. However, the VIH and the VIL of the design described herein in is substantially constant between the fresh and the aged design.

Figure 11:
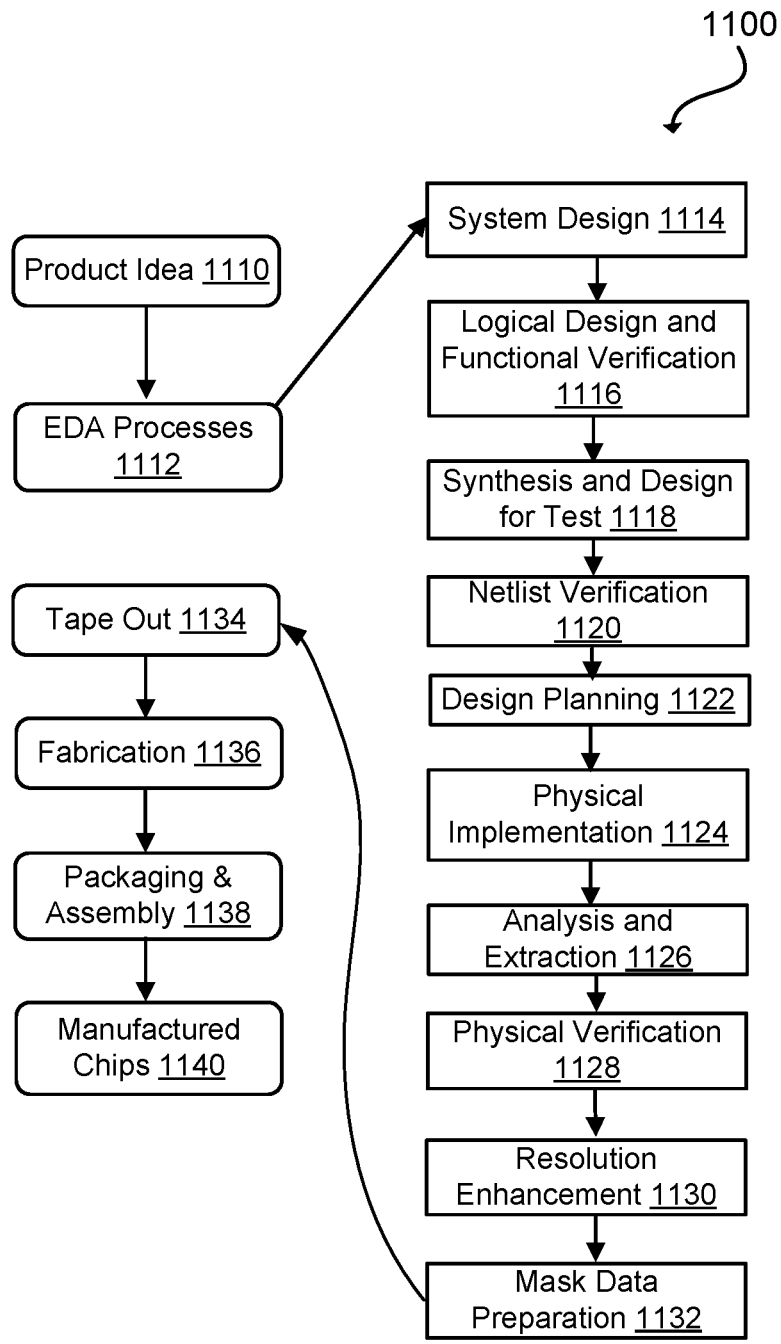
FIG. 11 depicts a flowchart of various processes used during the design and manufacture of an integrated circuit in accordance with some embodiments of the present disclosure.

FIG. 11 illustrates an example set of processes 1100 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1110 with information supplied by a designer, information which is transformed to create an article of manufacture that uses a set of EDA processes 1112. When the design is finalized, the design is taped-out 1134, which is when artwork (e.g., geometric patterns) for the integrated circuit is sent to a fabrication facility to manufacture the mask set, which is then used to manufacture the integrated circuit. After tape-out, a semiconductor die is fabricated 1136 and packaging and assembly processes 1138 are performed to produce the finished integrated circuit 1140.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 11. The processes described can be enabled by EDA products (or tools).

During system design 1114, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1116, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1118, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1120, the netlist is checked for compliance with timing constraints and for correspondence with the HDL code. During design planning 1122, an overall floor plan for the integrated circuit is constructed and analyzed for timing and top-level routing.

During layout or physical implementation 1124, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1126, the circuit function is verified at the layout level, which permits refinement of the layout design. During physical verification 1128, the layout design is checked to ensure that manufacturing constraints are correct, such as DRC constraints, electrical constraints, lithographic constraints, and that circuitry function matches the HDL design specification. During resolution enhancement 1130, the geometry of the layout is transformed to improve how the circuit design is manufactured.

During tape-out, data is created to be used (after lithographic enhancements are applied if appropriate) for production of lithography masks. During mask data preparation 1132, the 'tape-out' data is used to produce lithography masks that are used to produce finished integrated circuits.

A storage subsystem of a computer system (such as computer system 1200 of FIG. 12) may be used to store the programs and data structures that are used by some or all of the EDA products described herein, and products used for development of cells for the library and for physical and logical design that use the library.

Figure 12:
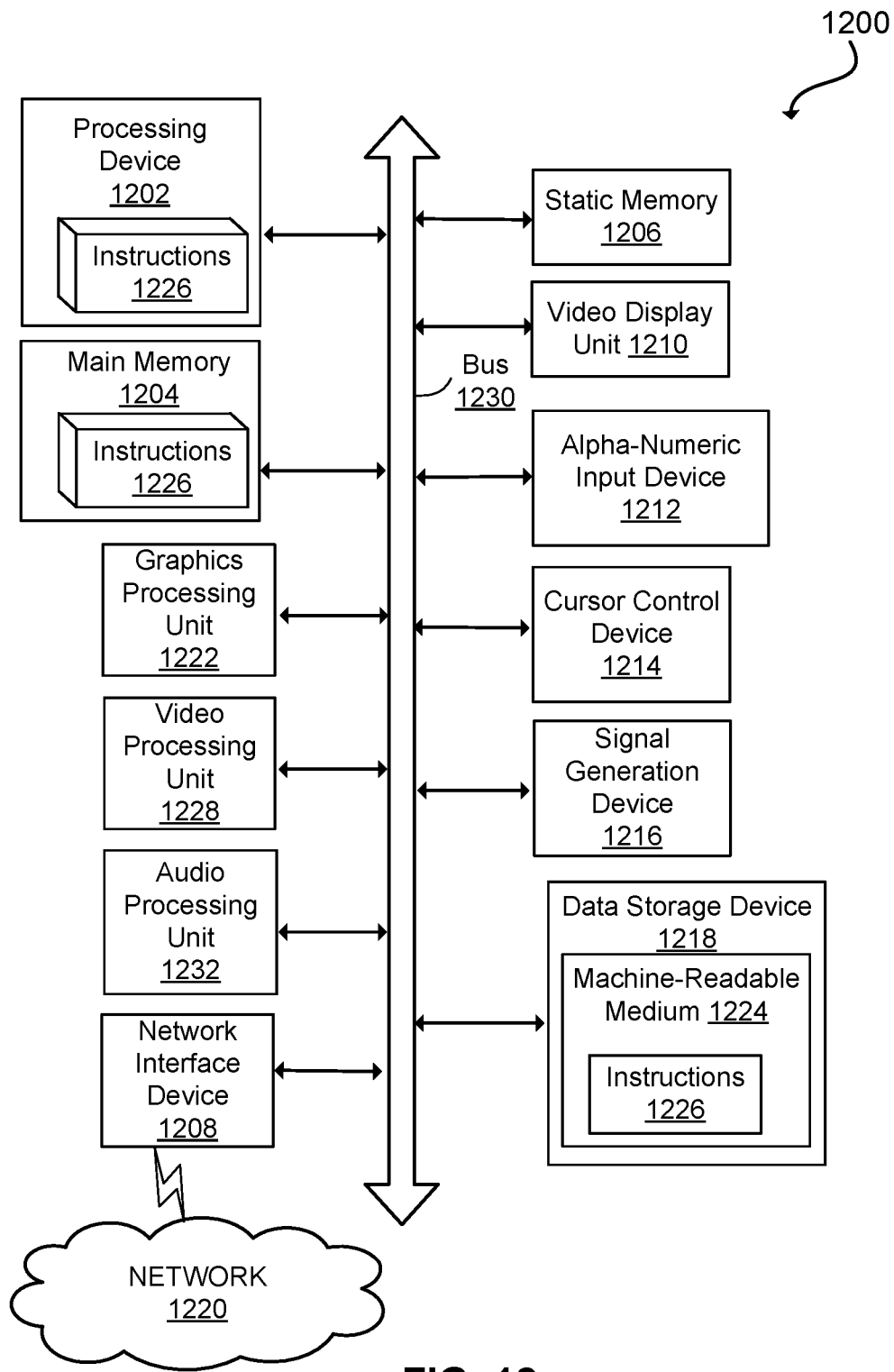
FIG. 12 depicts a diagram of an example computer system in which embodiments of the present disclosure may operate.

FIG. 12 illustrates an example machine of a computer system 1200 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM), a static memory 1206 (e.g., flash memory, static random access memory (SRAM), etc.), and a data storage device 1218, which communicate with each other via a bus 1230.

Processing device 1202 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 may also be one or more special-purpose processing devices such as an application specific integrated circuit (ASIC), a field programmable gate array (FPGA), a digital signal processor (DSP), network processor, or the like. The processing device 1202 may be configured to execute instructions 1226 for performing the operations and steps described herein.

The computer system 1200 may further include a network interface device 1208 to communicate over the network 1220. The computer system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), a graphics processing unit 1222, a signal generation device 1216 (e.g., a speaker), graphics processing unit 1222, video processing unit 1228, and audio processing unit 1232.

The data storage device 1218 may include a machine-readable storage medium 1224 (also known as a non-transitory computer-readable medium) on which is stored one or more sets of instructions 1226 or software embodying any one or more of the methodologies or functions described herein. The instructions 1226 may also reside, completely or at least partially, within the main memory 1204 and/or within the processing device 1202 during execution thereof by the computer system 1200, the main memory 1204 and the processing device 1202 also constituting machine-readable storage media.

In some implementations, the instructions 1226 include instructions to implement functionality corresponding to the present disclosure. While the machine-readable storage medium 1224 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1202 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. An input buffer circuit, comprising:
a tracking circuit that produces a tracking signal, wherein the tracking signal follows a first signal during a first time period when the first signal is between a first feedback signal and a second feedback signal and follows a second signal during a second time period; and
an inverter comprising a cascade of low voltage switching devices coupled to an output of the tracking circuit to receive the tracking signal, the inverter having an input high voltage/input low voltage (VIH/VIL) spread, wherein the tracking circuit is configured to reduce the VIH/VIL spread by controlling the tracking signal.

2. The input buffer circuit of claim 1, wherein the first signal corresponds to an input signal.

3. The input buffer circuit of claim 1, wherein the tracking circuit comprises a plurality of switching circuits, and wherein the plurality of switching circuits is configured to produce the tracking signal based on an input signal and internally generated biasing signals generated to protect the low voltage switching devices.

4. The input buffer circuit of claim 1, wherein the tracking circuit comprises a first switching circuit, a second switching circuit, and a third switching circuit;
wherein the first switching circuit comprises a first P-type transistor and a second P-type transistor connected in series;
wherein the second switching circuit comprises a first N-type transistor and a second N-type transistor connected in series;
wherein the third switching circuit comprises a third N-type transistor and a third P-type transistor connected in series, and a fourth P-type transistor and a fourth N-type transistor connected in series; and
wherein the tracking circuit is coupled to the inverter at respective sources of the second N-type transistor, the second P-type transistor, the third N-type transistor, and the fourth P-type transistor.

5. The input buffer circuit of claim 1, further comprising:
an input voltage limiting circuit coupled to an input of the tracking circuit, wherein the input voltage limiting circuit limits an input to the low voltage switching devices using an internally generated high reference voltage and an internally generated low reference voltage.

6. The input buffer circuit of claim 1, wherein the inverter further comprises:
a gain boosting section coupled to the tracking signal; and
a Schmitt section having an input coupled to an output of the gain boosting section.

7. The input buffer circuit of claim 6, wherein the Schmitt section comprises a first P-type transistor and a second P-type transistor coupled in series and a first N-type transistor and a second N-type transistor coupled in series.

8. The input buffer circuit of claim 6, wherein the gain boosting section comprises:
a first P-type transistor, a second P-type transistor, a first N-type transistor, and a second N-type transistor coupled in series, wherein respective gates of the first P-type transistor, the second P-type transistor, the first N-type transistor, and the second N-type transistor are coupled to the tracking signal.

9. The input buffer circuit of claim 1, wherein the tracking circuit and the inverter comprises devices having a tolerance of 1.8 V and the input buffer circuit operates at 3.3 V.

10. The input buffer circuit of claim 1, further comprising:
a feedback circuit coupled to the tracking circuit, wherein the feedback circuit is configured to introduce hysteresis.

11. The input buffer circuit of claim 10, wherein the feedback circuit comprises a first pair of transistors coupled to a first input of the tracking circuit, and a second pair of transistors coupled to a second input of the tracking circuit.

12. A circuit for an input buffer, the circuit comprising:
a tracking circuit that generates a tracking signal, wherein the tracking signal follows an input signal between a first value of the input signal and a second value of the input signal, wherein the first value and the second value are defined according to respectively generated feedback values; and
an inverter configured to receive the tracking signal at an input node, wherein the tracking circuit is configured to reduce a spread between a high trip point and a low trip point of the inverter.

13. The circuit of claim 12, the wherein the tracking circuit comprises:
a first P-type transistor and a second P-type transistor connected in series;
a first N-type transistor and a second N-type transistor connected in series;
a third N-type transistor and a third P-type transistor connected in series, and a fourth P-type transistor and a fourth N-type transistor connected in series; and
wherein the tracking circuit is coupled to the inverter at respective sources of the second-type transistor, the second P-type transistor, the third N-type transistor and the fourth P-type transistor.

14. The circuit of claim 12, wherein the inverter comprises a cascade of low voltage switching devices; and the circuit further comprising:
an input voltage limiting circuit coupled to an input of the tracking circuit, wherein the input voltage limiting circuit limits an input to the low voltage switching devices using an internally generated high reference voltage and an internally generated low reference voltage.

15. The circuit of claim 14, wherein the inverter comprises a gain boosting section including a plurality of transistors, wherein respective gates of the plurality of transistors are coupled to an output of the tracking circuit.

16. The circuit of claim 15, wherein the gain boosting section is coupled between a P-type transistor and a N-type transistor, wherein a source of the P-type transistor is coupled to a supply power and a source of the N-type transistor is coupled to a ground.

17. The circuit of claim 12, wherein the tracking circuit and the inverter comprises devices having a tolerance of 1.8 V and the circuit operates at 3.3 V.

18. The circuit of claim 12, further comprising:
   a feedback circuit coupled to the tracking circuit, wherein the feedback circuit is configured to introduce hysteresis.

19. The circuit of claim 18, wherein the feedback circuit comprises a first pair of transistors coupled to a first input of the tracking circuit, and a second pair of transistors coupled to a second input of the tracking circuit.

20. An integrated circuit, comprising
   an inverter comprising a cascade of low voltage switching devices, the inverter having an input high voltage/input low voltage (VIH-VIL) spread;
   an input voltage limiting circuit; and
   a selection circuit configured to select one of an output of the input voltage limiting circuit or an input signal to provide an input for the inverter, wherein the selection circuit is configured to select the input signal for an input to the inverter during a first time period when the input signal is between a first feedback signal and a second feedback signal, wherein the selection circuit is configured to reduce the VIH/VIL spread of the inverter by controlling the input for the inverter.

* * * * *